(12) United States Patent
Watanabe

(10) Patent No.: US 11,374,157 B2
(45) Date of Patent: Jun. 28, 2022

(54) LIGHT ILLUMINATING APPARATUS

(71) Applicant: HOYA CANDEO OPTRONICS CORPORATION, Toda (JP)

(72) Inventor: Hiroaki Watanabe, Toda (JP)

(73) Assignee: HOYA CORPORATION, Tokyo (JP)

( * ) Notice: Subject to any disclaimer, the term of this patent is extended or adjusted under 35 U.S.C. 154(b) by 427 days.

(21) Appl. No.: 16/726,318

(22) Filed: Dec. 24, 2019

(65) Prior Publication Data
US 2020/0205313 A1 Jun. 25, 2020

(30) Foreign Application Priority Data
Dec. 24, 2018 (JP) .............................. JP2018-240424

(51) Int. Cl.
*H01L 33/64* (2010.01)
*H05K 7/20* (2006.01)
*B41J 11/00* (2006.01)

(52) U.S. Cl.
CPC ......... *H01L 33/648* (2013.01); *B41J 11/0022* (2021.01); *B41J 11/00214* (2021.01); *H05K 7/2039* (2013.01); *H05K 7/20163* (2013.01)

(58) Field of Classification Search
CPC ............... H01L 33/648; B41J 11/00214; B41J 11/0022; H05K 7/20163; H05K 7/2039; B41F 23/0486; F21V 29/50; F21V 29/673; F21V 29/74; B29C 35/08; B41M 5/5209
See application file for complete search history.

(56) References Cited

U.S. PATENT DOCUMENTS

2021/0088207 A1\* 3/2021 Murayama ................ F21S 4/28

FOREIGN PATENT DOCUMENTS

| JP | 2013-252720 A | 12/2013 |
| JP | 2016-013548 A | 1/2016 |

\* cited by examiner

*Primary Examiner* — Bradley W Thies
(74) *Attorney, Agent, or Firm* — Rabin & Berdo, P.C.

(57) ABSTRACT

(Problem)
To provide a small light illuminating apparatus configured to uniformly cool a plurality of light emitting diodes (LEDs)
(Problem-solving approach)
A light illuminating apparatus that irradiates light of a line shape includes a light source unit having a plurality of light sources arranged along a first direction on a surface of a substrate, a heat dissipation unit having a plurality of heat sink fins formed along the first direction, and thermally coupled to an opposing surface side of the substrate, a housing which receives the heat dissipation unit and forms a wind tunnel with a cooling wind flowing inside, wherein the cooling wind cools the heat sink fins, and a first cooling fan which generates the cooling wind flowing in the first direction within the wind tunnel, wherein at least one of opposite sides of a second direction of the housing has an air hole through which the cooling wind is discharged to outside via the plurality of heat sink fins, or the cooling wind is absorbed via the plurality of heat sink fins from outside, and the wind tunnel serves as a pressure chamber in which positive pressure or negative pressure is produced by the cooling wind.

17 Claims, 9 Drawing Sheets

LIGHT ILLUMINATING APPARATUS

TECHNICAL FIELD

The present disclosure relates to a light illuminating apparatus having a light emitting diode (LED) as a light source and which irradiates light of a line shape, and more particularly, to a light illuminating apparatus with a heat dissipation element for dissipating heat emitted from an LED.

BACKGROUND ART

Conventionally, as an ink for printing a container, for example, a can/plastic bottle for beer or juice or a shampoo or cosmetic bottle, an ultraviolet (UV) curable ink is used, and it is cured by irradiation of UV light. Additionally, a light illuminating apparatus that irradiates UV light is generally used to cure the UV curable ink.

For example, Patent Literature 1 discloses an image formation apparatus for forming an image on the outer peripheral surface of a can body (a scan target) using an inkjet head. This apparatus includes a support cylinder (mandrel) inserted into the can body to support the can body, an inkjet head to jet a UV curable ink to the outer peripheral surface of the can body that the support cylinder supports, and a UV light emitting diode (LED) lamp (a light illuminating apparatus). Additionally, the apparatus jets the UV curable ink while rotating the can body to form an image on the outer peripheral surface of the can body, and irradiates UV light from the UV LED lamp onto the outer peripheral surface of the can body to cure the UV curable ink attached to the outer peripheral surface of the can body.

Additionally, Patent Literature 2 discloses a printing apparatus including a delivery unit to deliver a printing medium, six heads arranged in the delivery direction, each configured to jet Cyan, Magenta, Yellow, Black, Orange and Green color inks, six pre-curing irradiation units (light illuminating apparatus) arranged on the delivery direction downstream side between each head to pre-cure (peening) the dot ink jetted from each head onto the print medium, and a curing irradiation unit to cure the dot ink which is then settled down on the printing medium. Additionally, as the pre-curing irradiation unit uses an LED as a light source from a request for lightweight and compact design of the printing apparatus itself, a plurality of LEDs is arranged along the widthwise direction of the printing medium.

RELATED LITERATURES

Patent Literatures

Japanese Patent Publication No. 2016-013548
Japanese Patent Publication No. 2013-252720

Non-Patent Literatures

DISCLOSURE

Technical Problem

Like the light illuminating apparatus disclosed by Patent Literatures 1 and 2, when a light emitting diode (LED) is used as a light source, because most of inputted power turns into heat, emission efficiency and life are reduced by heat generated from the LED itself. Additionally, because the light illuminating apparatus (i.e., the housing) itself is also heated by the heat generated from the LED, it is impossible to place peripheral components near the light illuminating apparatus, resulting in an increase in the entire apparatus size.

In the case of an apparatus having a plurality of LEDs mounted thereon in the same way as the light illuminating apparatus of Patent Literature 2, this problem is severer because of a larger number of LEDs serving as a heat source. Additionally, when a UV LED is used as a light source as in the light illuminating apparatus of Patent Literatures 1 and 2, it is also severe because of a larger amount of heat generated from the LED itself. By this reason, in the light illuminating apparatus using an LED as a light source, generally, a heat dissipation element, for example, a heat sink is employed to suppress the heat generation of the LED.

As described above, it is effective to use a heat dissipation element, for example, a heat sink, to suppress the heat generation of the LED. However, in the configuration in which a plurality of LEDs is arranged as in the light illuminating apparatus of Patent Literature 2, unless each LED is uniformly cooled (i.e., unless the temperature is almost uniform), lighting non-uniformity occurs by a temperature difference between each LED, and non-uniformity also occurs in the cure of the UV curable ink on the scan target. In the specification, a state in which the temperature is almost uniform refers to a state in which there is a temperature difference causing no problem in the actual use of the light illuminating apparatus of the present disclosure, for example, a state in which a temperature difference is 10° C. or less.

In view of this circumstance, the present disclosure is directed to providing a small light illuminating apparatus configured to uniformly cool a plurality of LEDs with preventing a housing from being heated.

Technical Solution

To achieve the above-described object, a light illuminating apparatus of the present disclosure is a light illuminating apparatus that irradiates, onto a target surface, light of a line shape extending in a first direction and having a predetermined line width in a second direction perpendicular to the first direction, the light illuminating apparatus including a substrate extending in the first direction, a light source unit having a plurality of light sources arranged along the first direction on a surface of the substrate, a heat dissipation unit having a plurality of heat sink fins installed erectly at a predetermined interval along the first direction, and thermally coupled to an opposing surface side of the substrate, a housing which receives the heat dissipation unit and forms a wind tunnel with a cooling wind flowing inside, wherein the cooling wind cools the heat sink fins, and a first cooling fan which generates the cooling wind flowing in the first direction within the wind tunnel, wherein at least one of opposite sides of the second direction of the housing has an air hole through which the cooling wind is discharged to outside via the plurality of heat sink fins, or the cooling wind is absorbed via the plurality of heat sink fins from outside, and the wind tunnel serves as a pressure chamber in which positive pressure or negative pressure is produced by the cooling wind.

According to this configuration, because an amount of air flowing between each heat sink fin is almost uniform, the heat dissipation unit is uniformly cooled. Accordingly, the temperature of the plurality of light sources is almost uniform, and lighting non-uniformity is suppressed.

Additionally, preferably, at least one of opposite sides of the second direction of the housing comes into contact with the plurality of heat sink fins.

Additionally, preferably, the air hole is formed such that bases of the plurality of heat sink fins are exposed to the outside.

Additionally, preferably, a ratio of a cross-sectional area of the second direction of the wind tunnel and an opening area of the air hole is set to 1:0.7-1:1.4. Additionally, in this case, preferably, when a length of the second direction of the air hole is L1, and a length of the second direction of each heat sink fin is h, the following conditional expression (1) is satisfied:

$$0.1 \cdot h \leq L1 \leq 0.5 \cdot h \tag{1}$$

Additionally, preferably, the housing has a partition to divide the wind tunnel, and an area in which the plurality of heat sink fins is arranged, the partition has a through-hole formed in communication with the wind tunnel and the area in which the plurality of heat sink fins is arranged, and a ratio of a cross-sectional area of the second direction of the wind tunnel and an opening area of the through-hole is set to 1:0.7-1:1.4. Additionally, in this case, preferably, the opening area of the air hole is larger than the opening area of the through-hole.

Additionally, preferably, the first cooling fan is installed on one surface of the first direction of the housing. Additionally, in this case, the light illuminating apparatus may include a second cooling fan installed on the other surface of the first direction of the housing to generate the cooling wind flowing in a direction opposite to the first direction.

Additionally, preferably, the light is light including a wavelength that acts on an ultraviolet curable resin.

Advantageous Effects

As described above, according to the present disclosure, it is possible to realize a small light illuminating apparatus that uniformly cools the plurality of light emitting diodes (LEDs) with preventing the housing from being heated.

MODE FOR INVENTION

Figure 1A:
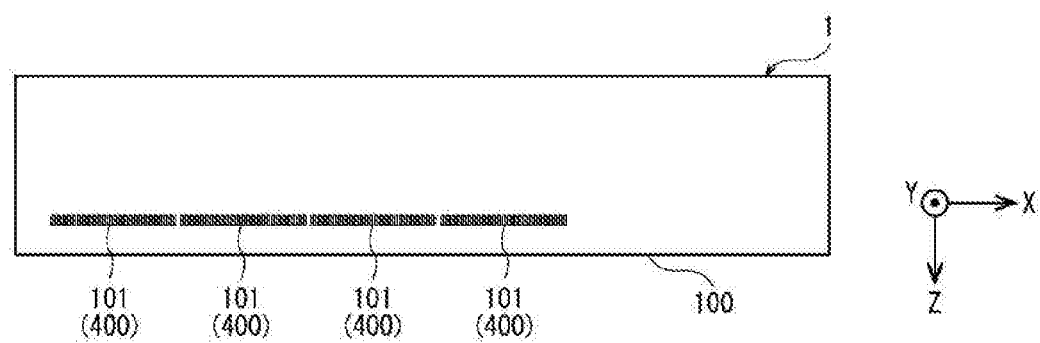
FIGS. 1A-1D are diagrams showing the outward appearance of a light illuminating apparatus according to a first embodiment of the present disclosure.
Figure 1B:
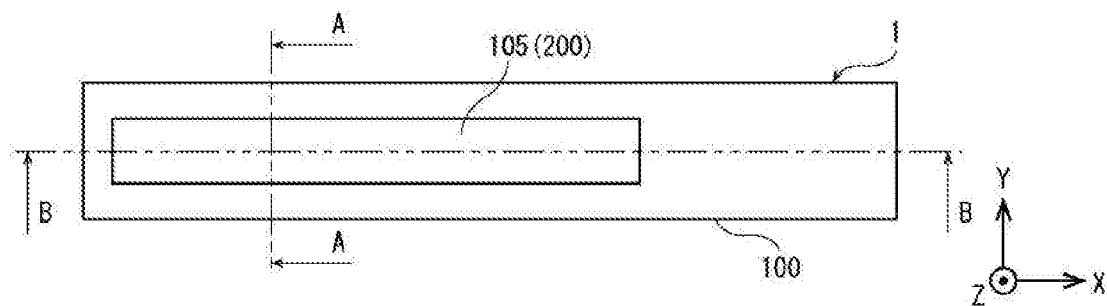
Figure 1C:
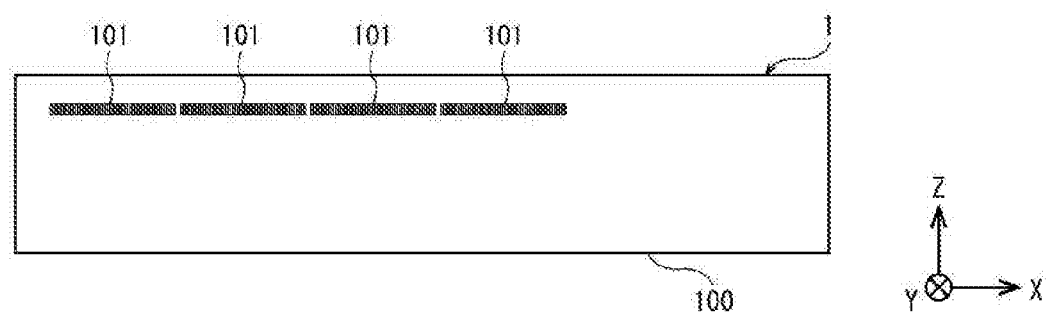
Figure 1D:
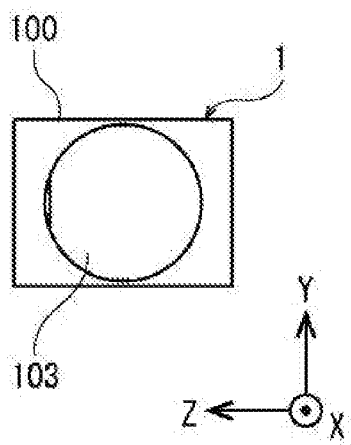

Hereinafter, the embodiments of the present disclosure will be described in detail with reference to the accompanying drawings. Additionally, in the drawings, the same reference sign is affixed to identical or equivalent parts and its description is not repeated herein.

First Embodiment

FIG. 1 is a diagram showing the outward appearance of a light illuminating apparatus 1 according to a first embodiment of the present disclosure, and FIG. 1A is a front view of the light illuminating apparatus 1. Additionally, FIG. 1B is a top view of the light illuminating apparatus 1, FIG. 1C is a bottom view of the light illuminating apparatus 1, and FIG. 1D is a right side view of the light illuminating apparatus 1. The light illuminating apparatus 1 of this embodiment is a light source device that is mounted in a printer, and cures an ultraviolet (UV) curable ink or a UV curable resin, and for example, is disposed above a target, and emits UV light of line shape to the target. Additionally, in the specification, as shown in the coordinates of FIG. 1, a direction in which a light emitting diode (LED) device 210 as described below emits UV light is defined as a Z-axis direction, a direction in which the LED devices 210 are arranged is defined as an X-axis direction, and a direction perpendicular to the Z-axis direction and the X-axis direction is defined as a Y-axis direction.

As shown in FIG. 1, the light illuminating apparatus 1 of this embodiment includes a housing 100 in the shape of a box that is long in X-axis direction to receive a light source unit 200 or a heat dissipation element 400 therein. The housing 100 has a window 105 of glass, through which UV light is emitted, on the front side. Additionally, air hole 101 that discharges air within the housing 100 is formed on the opposite sides (i.e., top and bottom) of Y-axis direction of the housing 100, and a cooling fan 103 that supplies air into the housing 100 is disposed on the right side. Additionally, a connector (not shown) for supplying the power source to the light illuminating apparatus 1 is installed on the back side of the housing 100, and the connector (not shown) is electrically connected to a power supplier (not shown) to supply the power source to the light illuminating apparatus 1.

Figure 2A:
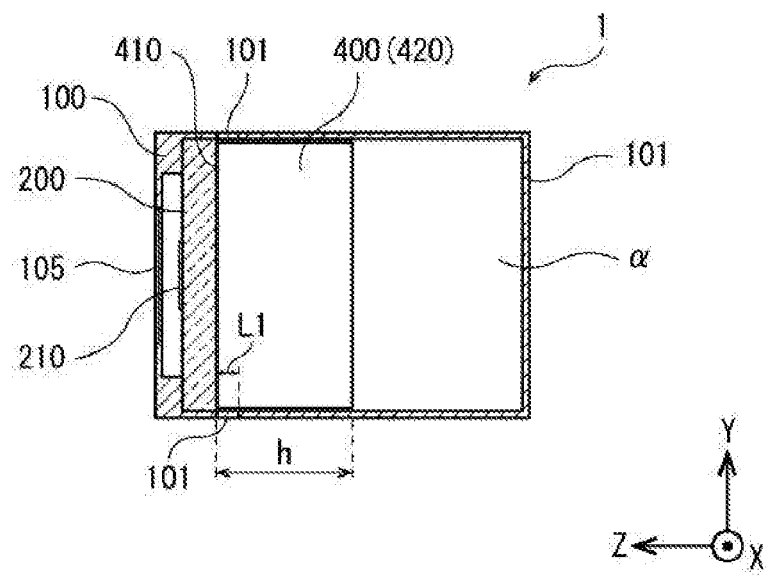
FIGS. 2A and 2B are diagrams illustrating the internal configuration of a light illuminating apparatus according to a first embodiment of the present disclosure.
Figure 2B:
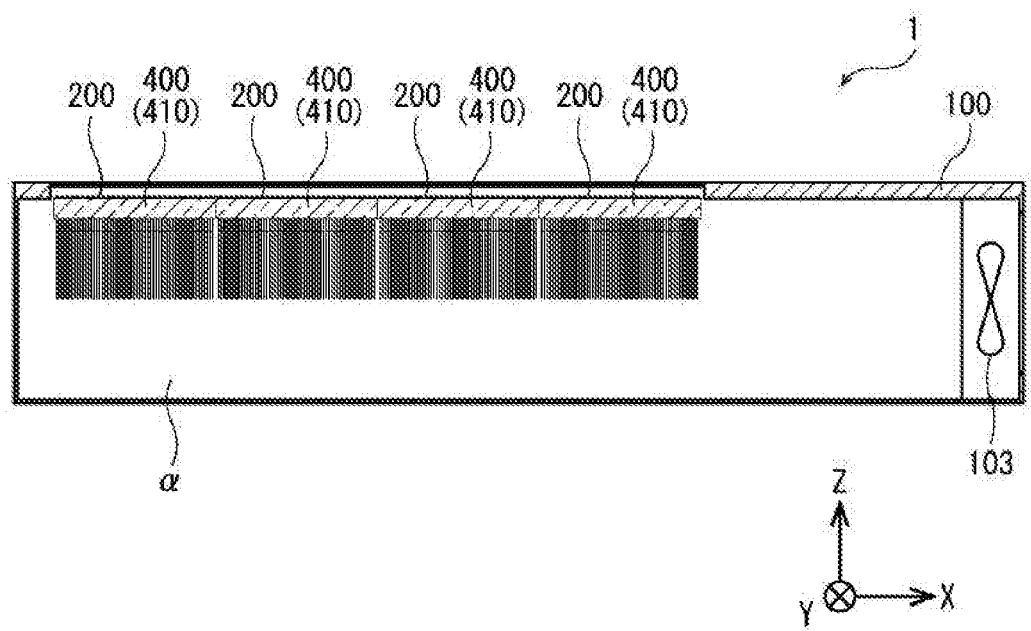

FIG. 2 is a diagram illustrating the internal configuration of the light illuminating apparatus 1 according to an embodiment of the present disclosure, FIG. 2A is a cross-sectional view taken along the line A-A of FIG. 1, and FIG. 2B is a cross-sectional view taken along the line B-B of FIG. 1. Additionally, in FIG. 2, for clarity of the drawings, some components of the light illuminating apparatus 1, for example, an internal wiring cable, are omitted herein.

As shown in FIG. 2, the light illuminating apparatus 1 of this embodiment includes four light source units 200 arranged in X-axis direction, four heat dissipation elements 400 arranged in X-axis direction, and an LED driving circuit (not shown in FIG. 2) in the housing 100. Additionally, each light source unit 200 and each heat dissipation element 400 has perfectly identical configuration. Additionally, as shown in FIG. 2B, in this embodiment, the light source units 200 and the heat dissipation elements 400 are only arranged on the side of a direction opposite to X-axis direction within the housing 100.

Figure 3A:
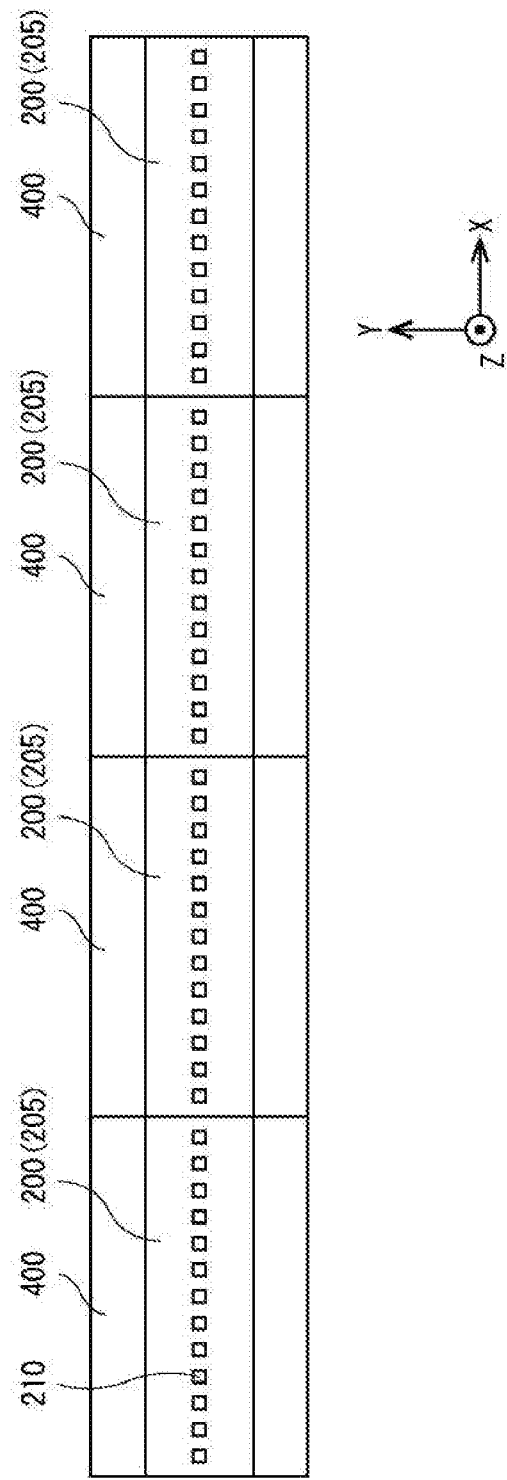
FIGS. 3A and 3B are schematic diagrams illustrating the configuration of a light source unit and a heat dissipation element provided in a light illuminating apparatus according to a first embodiment of the present disclosure.
Figure 3B:
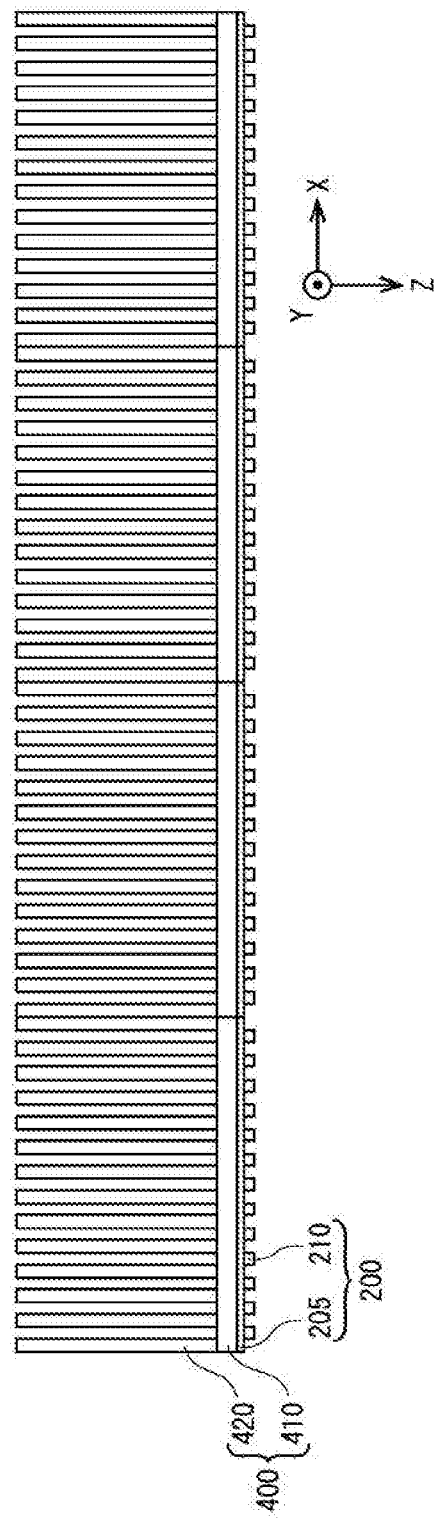

FIG. 3 is a schematic diagram illustrating the configuration of the light source unit 200 and the heat dissipation element 400 of this embodiment, FIG. 3A is a front view when viewed from the Z-axis direction, and FIG. 3B is a plane view when viewed from the Y-axis direction. As shown in FIG. 3, the light source unit 200 includes a substrate 205 of a rectangular plate shape parallel to X-axis direction and Y-axis direction, and a plurality of (for example, 10) LED devices 210 having the same characteristics, and is fixed on one surface (Z-axis direction surface) of a heat sink 410 of the heat dissipation element 400.

The plurality of LED devices 210 is arranged in a line on the surface of the substrate 205 at a predetermined interval in X-axis direction with optical axes aligned in Z-axis direction, and is electrically connected to the substrate 205. Additionally, the substrate 205 is electrically connected to each other by the wiring cable (not shown) extending from the LED driving circuit (not shown), and the operating current from the LED driving circuit is supplied to each LED device 210. When the operating current is supplied to each LED device 210, a corresponding amount of UV light (for example, wavelength 365 nm) to the operating current is emitted from each LED device 210, and UV light of line shape extending in X-axis direction from the light source unit 200 and having a predetermined line width in Y-axis direction perpendicular to X-axis direction is emitted. As shown in FIG. 3, in this embodiment, four light source units 200 are arranged in X-axis direction, and UV light of line shape emitted from each light source unit 200 is continuous in X-axis direction.

The heat dissipation element 400 is an element that dissipates heat generated from the light source unit 200. The heat dissipation element 400 of this embodiment includes a heat sink 410 made of metal (for example, copper, aluminum) of a rectangular plate shape, and a plurality of heat sink fins 420 welded to the other surface (a surface on the opposite side to the surface on which the light source unit 200 is disposed) of the heat sink 410 (FIGS. 2A and 3B). The heat sink fin 420 is an element of metal (for example, metal such as copper, aluminum, iron, magnesium or their alloys) of a rectangular plate shape, installed erectly such that it protrudes in the direction opposite to Z-axis direction from the heat sink 410, and dissipates heat transferred to the heat sink 410 in air. Additionally, as described in detail below, in this embodiment, when air is introduced into the housing 100 from the outside by the cooling fan 103, the introduced air flows as cooling wind over the surface of each heat sink fin 420, and air heated by the heat sink fins 420 is quickly discharged through the air hole 101.

Additionally, as shown in FIG. 2A, the light source unit 200 and the heat dissipation element 400 of this embodiment are disposed and fixed to the front side (Z-axis direction side) within the housing 100. Additionally, when the light source unit 200 and the heat dissipation element 400 are fixed within the housing 100, each LED device 210 is disposed at the location opposite to the window 105, each heat sink fin 420 comes into contact with the opposite sides (i.e., top and bottom) of Y-axis direction of the housing 100, and the base of each heat sink fin 420 is exposed to the outside from the air hole 101. Additionally, as shown in FIGS. 2A and B, a wind tunnel α in which cooling wind for cooling the heat sink fin 420 flows is formed on the back side of the heat dissipation element 400 (the direction opposite to the Z-axis direction).

Each LED device 210 of this embodiment is such that the operating current supplied to each LED device 210 is controlled to emit an almost uniform amount of UV light, and thus UV light of line shape emitted from the light source unit 200 has an almost uniform light distribution in X-axis direction.

When the operating current flows in each LED device 210, and UV light is emitted from each LED device 210, the temperature rises by self-heat generation of the LED devices 210, and heat generated from each LED device 210 is quickly transferred (moved) to the heat sink fins 420 through the substrate 205 and the heat sink 410, and dissipated in the surrounding air from each heat sink fin 420. Additionally, air heated by the heat sink fins 420 is quickly discharged through the air hole 101 by the cooling wind flowing over the surface of each heat sink fin 420.

Here, in the configuration of this embodiment, because four light source units 200 and four heat dissipation elements 400 are arranged in X-axis direction, when the temperature of the LED devices 210 of each light source unit 200 is different, lighting non-uniformity occurs, and thus, for uniform lighting, it is necessary to uniformly cool the four heat dissipation elements 400 disposed at different distances from the cooling fan 103. Accordingly, to solve this problem, in this embodiment, the wind tunnel α in which the heat dissipation elements 400 are arranged serves as a sort of pressure chamber to make the pressure of air in the area where the heat dissipation elements 400 are arranged almost uniform. Additionally, an amount of air flowing between each heat sink fin 420 is almost equal, thereby allowing uniform cooling of the four heat dissipation elements 400.

Figure 4A:
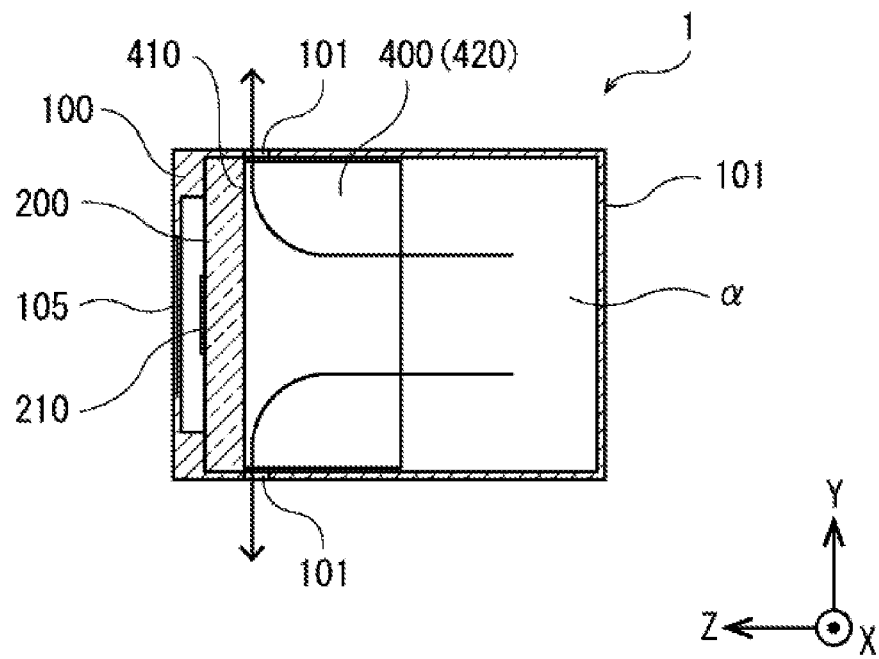
FIGS. 4A and 4B are schematic diagrams illustrating a relationship between a heat dissipation element provided in a light illuminating apparatus according to a first embodiment of the present disclosure and an air flow generated in a housing.
Figure 4B:
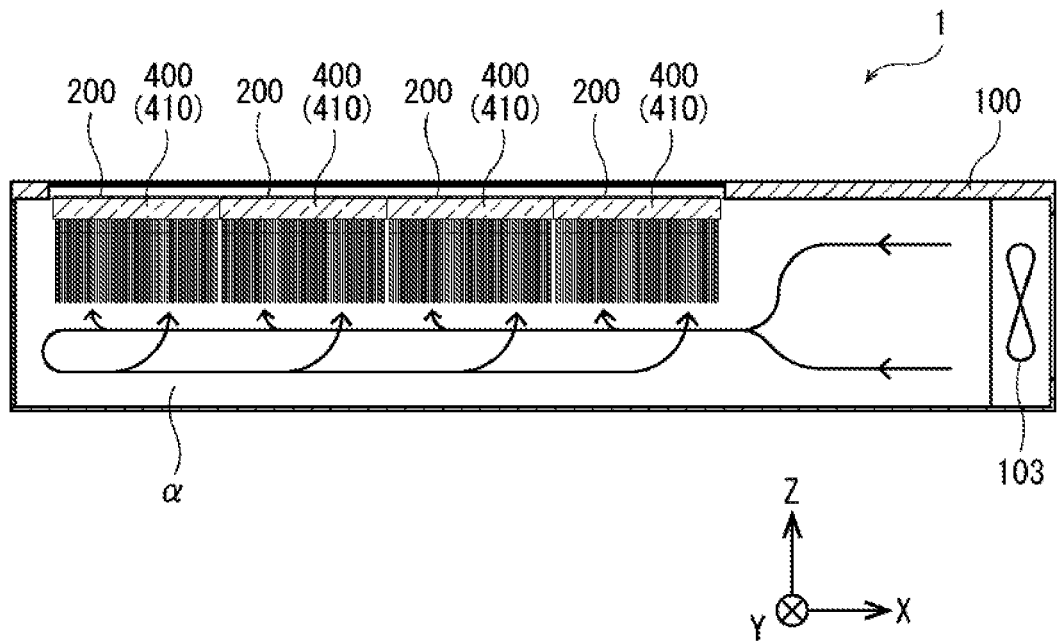

Hereinafter, the feature of the present disclosure, that is, the cooling operation of the heat dissipation element 400 is described. FIG. 4 is a schematic diagram illustrating a relationship between the heat dissipation element 400 and the air flow generated in the housing 100. Additionally, FIG. 4A is a diagram in which an arrow indicating the direction of air flow is added to FIG. 2A, and FIG. 4B is a diagram in which an arrow indicating the direction of air flow is added to FIG. 2B.

As shown in FIG. 4B, the light illuminating apparatus 1 of this embodiment includes the cooling fan 103 on the right side of the housing 100, and the air hole 101 on the top and bottom of the housing 100. Accordingly, when the cooling fan 103 rotates, air outside of the housing 100 is introduced from the cooling fan 103, and positive pressure is produced in the housing 100, and thus air inside of the housing 100 is discharged from the air hole 101. More specifically, air flow indicated by the solid arrow in FIG. 4B is generated in the housing 100, and air introduced into the housing 100 from the cooling fan 103 flows in the direction opposite to X-axis direction within the wind tunnel α, and because the left side surface of the housing 100 (the surface on the left side in FIG. 4B) is not open, positive pressure is produced in the wind tunnel α. Additionally, air of the wind tunnel α tends to be introduced in between each heat sink fin 420, and because the direction of air flow bends 90°, the air pressure in the wind tunnel α increases and the air speed reduces. By this reason, an amount of air introduced in between each heat sink fin 420 from the wind tunnel α is almost uniform, and an almost uniform amount of air flows over each of the surfaces of the heat sink fins 420 of each heat dissipation element 400, and is discharged from the air hole 101. By this reason, each heat dissipation element 400 is cooled almost uniformly.

As described above, in this embodiment, the direction of the cooling wind generated by the cooling fan 103 (the direction opposite to X-axis direction) and the direction in which the heat sink fins 420 extend and are installed (the direction opposite to Z-axis direction) are different by 90°, and the direction in which the heat sink fins 420 extend and are installed and the direction in which the air hole 101 is disposed (Y-axis direction) are different by 90°, and the wind tunnel α serves as a sort of pressure chamber. Additionally, the cross-sectional area in the YZ plane of the wind tunnel α and the opening area of the air hole 101 are set such that the pressure of air in the area in which the heat sink fins 420 are arranged is almost uniform. Specifically, a ratio of the opening area of the air hole 101 to the cross-sectional area in the YZ plane of the wind tunnel α is set to 1:0.7-1:1.4. Additionally, in the specification, the sum of the areas of gaps (openings) of the heat sink fins 420 exposed from the air hole 101 (i.e., the substantial opening area taking the thickness of the heat sink fins 420 into account) is represented as ⌈opening area of the air hole 101⌋. Additionally, to increase the pressure within the wind tunnel α, it is preferred that the length of Z-axis direction of the air hole 101 is smaller than the length of Z-axis direction of the heat sink fins 420 (i.e., the opening area of the air hole 101 is small), and when the air hole 101 is too small, a flow of cooling wind is not good, and the temperature of the heat sink fins 420 rises, and accordingly, in this embodiment, when the length of Z-axis direction of the air hole 101 is L1, and the length of Z-axis direction of the heat sink fins 420 is h, the following conditional expression (1) is satisfied (FIG. 2A).

$$0.1 \cdot h \le L1 \le 0.5 \cdot h \qquad (1)$$

Table 1 is a table explaining a result of simulating a relationship between the cross-sectional area in the YZ plane of the wind tunnel α and the opening area of the air hole 101 from the perspective of temperature of the heat dissipation element 400.

TABLE 1

| No. | cross-sectional area of the wind tunnel:opening area of the air hole | maximum temperature [° C.] | average temperature [° C.] | minimum temperature [° C.] | temperature difference [° C.] |
|---|---|---|---|---|---|
| | | temperature of the heat dissipation element | | | |
| example 1 | 1:0.715 | 61.65 | 60.57 | 58.58 | 3.07 |
| example 2 | 1:0.715 | 67.24 | 66.04 | 63.2 | 4.04 |
| example 3 | 1:1.1 | 61.05 | 59.55 | 58.18 | 2.87 |
| example 4 | 1:1.1 | 66.33 | 65.26 | 63.69 | 2.64 |
| example 5 | 1:1.43 | 64.24 | 59.82 | 57.03 | 7.21 |
| comparative example 1 | 1:2.86 | 76.2 | 65.07 | 56.67 | 19.53 |
| comparative example 2 | 1:3.96 | 79.58 | 68.65 | 58.12 | 21.46 |

Table 1 shows simulation with varying ratios of opening area of the air hole 101 to the cross-sectional area in the YZ plane of the wind tunnel α as in examples 1-5 and comparative examples 1 and 2. Additionally, in Table 1, ⌈maximum temperature (° C.)⌋ denotes a maximum value of temperature of four heat dissipation elements 400, ⌈average temperature (° C.)⌋ denotes an average value of temperature of four heat dissipation elements 400, ⌈minimum temperature (° C.)⌋ denotes a minimum value of temperature of four heat dissipation elements 400, and ⌈temperature difference (° C.)⌋ denotes a difference between the maximum temperature (° C.) and the minimum temperature (° C.). Additionally, in examples 1, 3 and 5 and comparative examples 1 and 2, the air hole 101 is formed on the opposite sides (i.e., top and bottom) of Y-axis direction of the housing 100, and in examples 2 and 4, the air hole 101 is formed on any one (i.e., top or bottom) of the opposite sides of Y-axis direction of the housing 100, and simulation is performed with an amount of heat generation of 250 W.

As a result, as shown in Table 1, when the ratio of the opening area of the air hole 101 to the cross-sectional area in the YZ plane of the wind tunnel α is set to 1:0.7-1:1.4, and the above-described conditional expression (1) is satisfied, it can be seen that a temperature difference of the heat dissipation elements 400 is 10° C. or less (i.e., cooling the plurality of LED devices 210 without any problem in the actual use).

Additionally, in this embodiment, each heat sink fin 420 is designed such that they come into contact with the opposite sides (i.e., top and bottom) of Y-axis direction of the housing 100, and as shown in FIG. 4A, in Y-axis direction, there is no gap between the housing 100 and the fins 420. By this reason, as shown in FIGS. 4A and B, it is possible to effectively introduce air in between the fins 420 from the front end side of the fin 420 (the end side of the direction opposite to Z-axis direction).

Additionally, as described above, in this embodiment, because heat from the light source unit 200 transferred to the heat dissipation element 400 is cooled by the cooling wind supplied through the housing 100, the housing 100 itself is not heated. Accordingly, because other components can be placed near the light illuminating apparatus 1, it is possible to reduce the entire size of equipment into which the light illuminating apparatus 1 is incorporated.

While this embodiment has been hereinabove described, the present disclosure is not limited thereto, and various modifications may be made thereto within the scope of technical spirit of the present disclosure.

For example, although the light illuminating apparatus 1 of this embodiment is an apparatus that irradiates UV light, the present disclosure is not limited thereto, and may be applied to an apparatus that irradiate light of other wavelength bands (for example, visible light such as white light, infrared light).

Additionally, although in this embodiment, each heat sink fin 420 and the housing 100 come into contact with each other, the present disclosure is not limited thereto if air is certainly introduced in between the heat sink fins 420 from the front end side of the heat sink fin 420 (the end side of the direction opposite to Z-axis direction). For example, when a gap between the housing 100 and the heat sink fin 420 in Y-axis direction is A, and a distance of X-axis direction between the heat sink fins 420 is B, A<B is set, preferably A:B=0.5:1.0, and more preferably 0.1:1.0.

Additionally, although in this embodiment, the base of each heat sink fin 420 is exposed to the outside from the air hole 101, any part of the heat sink fin 420 may be exposed to the outside if each heat sink fin 420 is certainly cooled.

Additionally, although in this embodiment, the cooling fan 103 is an air absorption fan, positive pressure is produced in the housing 100, and air inside of the housing 100 is discharged from the air hole 101, the present disclosure is not limited thereto, and the cooling fan 103 may be an exhaust fan. In this case, the outside air is introduced from the air hole 101, negative pressure is produced in the housing 100, and an amount of air introduced in between each heat sink fin 420 is almost uniform, and thus each heat dissipation element 400 is cooled almost uniformly.

Second Embodiment

Figure 5A:
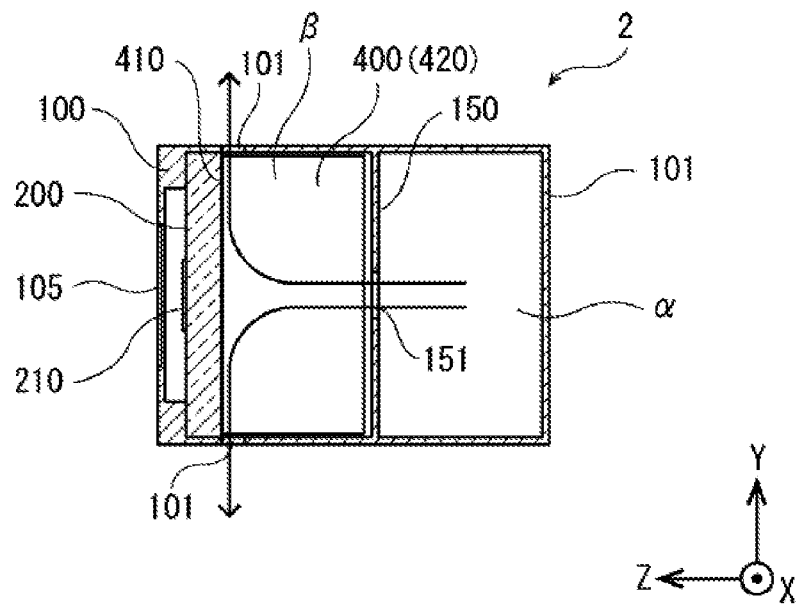
FIGS. 5A and 5B are diagrams illustrating the internal configuration of a light illuminating apparatus according to a second embodiment of the present disclosure.
Figure 5B:
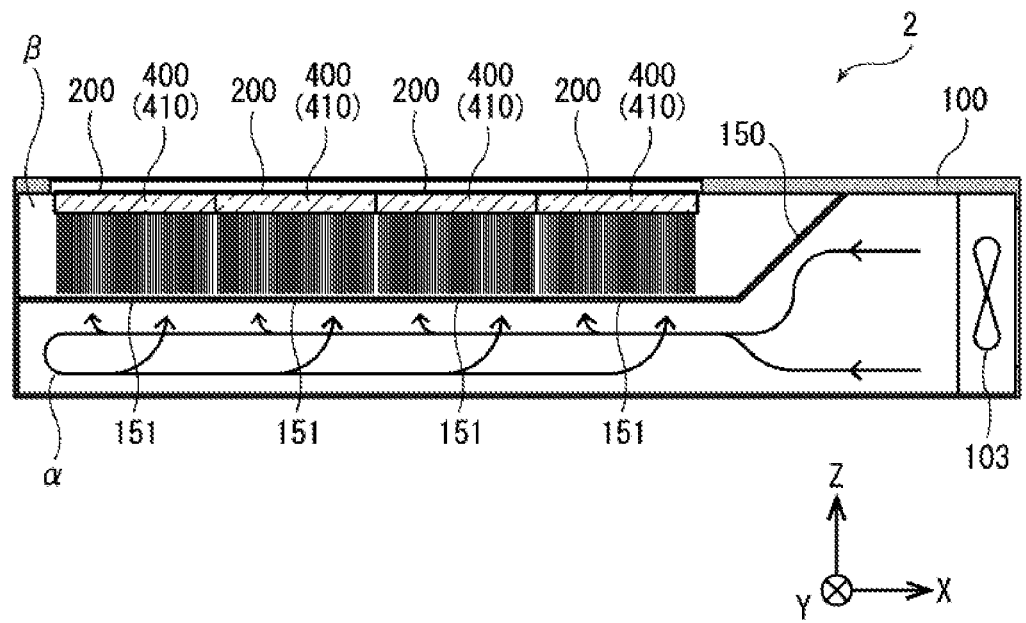

FIG. 5 is a cross-sectional view illustrating the internal configuration of a light illuminating apparatus 2 according to a second embodiment of the present disclosure. As shown in FIG. 5, the light illuminating apparatus 2 of this embodiment is different from the light illuminating apparatus 1 of the first embodiment in that a partition 150 is provided in the housing 100 to divide a wind tunnel α and a space β in which the heat sink fins 420 are arranged. Additionally, the partition 150 has a plurality of through-holes 151 that communicates with the wind tunnel α and the space β, as indicated by the arrow in FIG. 5, cooling wind introduced in between each heat sink fin 420 is supplied from the wind tunnel α through the through-holes 151.

Specifically, when the cooling fan 103 rotates, and air outside of the housing 100 is introduced from the cooling fan 103, air introduced into the housing 100 flows in the direction opposite to X-axis direction within the wind tunnel α, and because the left side surface of the housing 100 (the surface on the left side in FIG. 5B) is not open, positive pressure is produced in the wind tunnel α. Air of the wind tunnel α tends to be introduced in between each heat sink fin 420 through the through-holes 151, and because the direction of air flow bends 90°, the air pressure in the wind tunnel α increases and the air speed reduces. By this reason, an amount of air introduced into the through-holes 151 (i.e., between each heat sink fin 420) from the wind tunnel α is almost uniform, and an almost uniform amount of air flows over each of the surfaces of the heat sink fins 420 of each heat dissipation element 400 and is discharged from the air hole 101. By this reason, each heat dissipation element 400 is cooled almost uniformly.

As described above, in this embodiment, the direction of the cooling wind generated by the cooling fan 103 (the direction opposite to the X-axis direction) and the opening direction of the through-holes 151 (the Z-axis direction) are different by 90°, and the direction in which the heat sink fins 420 extend and are installed (the direction opposite to Z-axis direction) and the direction in which the air hole 101 is disposed (Y-axis direction) are different by 90°, and the wind tunnel α serves as a sort of pressure chamber. Additionally, the cross-sectional area in the YZ plane of the wind tunnel α and the opening area of the through-holes 151 are set such that the pressure of air in the area in which the through-holes 151 are arranged is almost uniform. Specifically, the ratio of the opening area of the through-holes 151 to the cross-sectional area in the YZ plane of the wind tunnel α is set to 1:0.7-1:1.4, and when the opening area of the air hole 101 is S1, and the opening area of the through-holes 151 is S2, the following conditional expression (2) is satisfied.

$$S1 \leq S2 \quad (2)$$

Additionally, in the specification, the sum of the areas of gaps (openings) of the heat sink fins 420 exposed from the through-holes 151 (i.e., substantial opening area taking the thickness of the heat sink fins 420 into account) is represented as ⌈opening area of the through-holes 151⌋.

Table 2 is a table explaining a result of simulating a relationship between the cross-sectional area in the YZ plane of the wind tunnel α and the opening area of the through-holes 151 from the perspective of temperature of the heat dissipation element 400.

TABLE 2

| | | temperature of the heat dissipation element | | | |
|---|---|---|---|---|---|
| No. | cross-sectional area of the wind tunnel:opening area of the through-holes | maximum temperature [° C.] | average temperature [° C.] | minimum temperature [° C.] | temperature difference [° C.] |
| example 6 | 1:0.715 | 62.12 | 60.08 | 58.79 | 3.33 |
| example 7 | 1:1.1 | 61.53 | 58.31 | 56.68 | 4.85 |
| example 8 | 1:0.715 | 64.86 | 60.08 | 57.35 | 7.51 |
| example 9 | 1:1.43 | 65.62 | 59.27 | 56.29 | 9.33 |

Table 2 shows simulation with varying ratios of the opening area of the through-holes 151 to the cross-sectional area in the YZ plane of the wind tunnel α as in examples 6-9. Additionally, in Table 2, ⌈maximum temperature (° C.)⌋ denotes a maximum value of temperature of four heat dissipation elements 400, ⌈average temperature (° C.)⌋ denotes an average value of temperature of four heat dissipation elements 400, ⌈minimum temperature (° C.)⌋ denotes a minimum value of temperature of four heat dissipation elements 400, ⌈temperature difference (° C.)⌋ denotes a difference between the maximum temperature (° C.) and the minimum temperature (° C.). Additionally, in examples 6-9, the air hole 101 is formed on the opposite sides (i.e., top and bottom) of Y-axis direction of the housing 100, and simulation is performed with an amount of heat generation of 250 W.

As a result of simulation, as shown in Table 2, when the ratio of the opening area of the through-holes 151 to the cross-sectional area in the YZ plane of the wind tunnel α is set to 1:0.7-1:1.4, and the above-described conditional expression (2) is satisfied, it can be seen that a temperature difference of the heat dissipation elements 400 is 10° C. or less (i.e., cooling the plurality of LED devices 210 without any problem in the actual use).

Third Embodiment

Figure 6A:
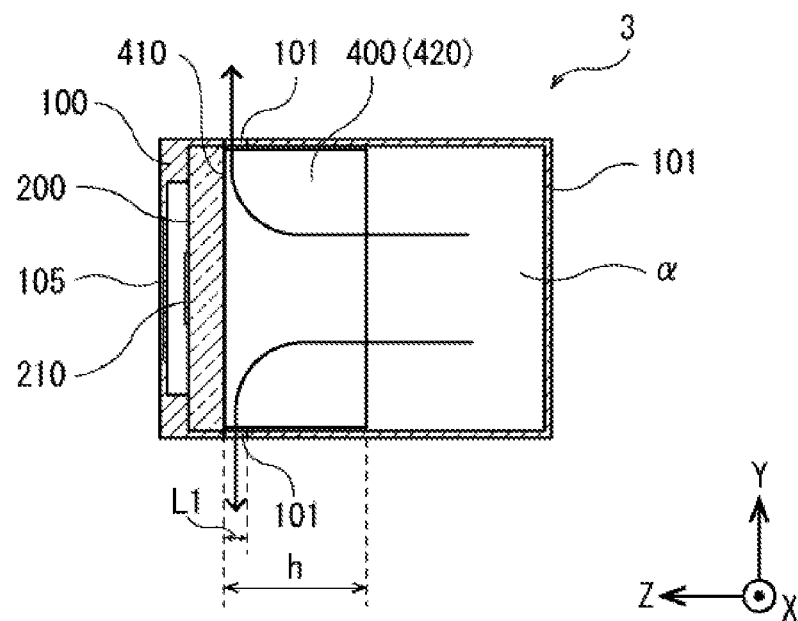
FIGS. 6A and 6B are diagrams illustrating the internal configuration of a light illuminating apparatus according to a third embodiment of the present disclosure.
Figure 6B:
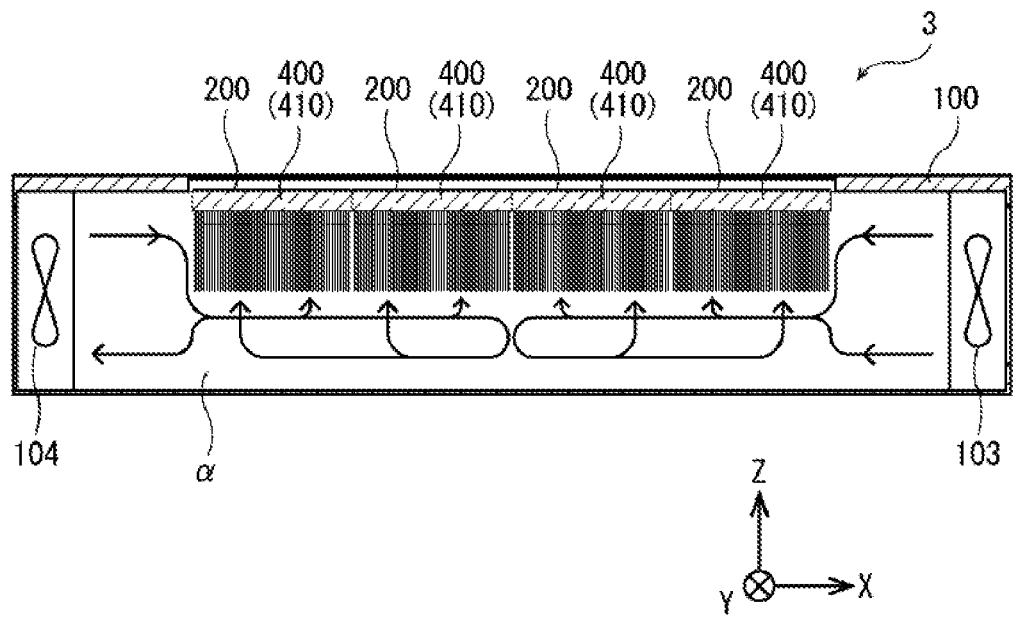

FIG. 6 is a cross-sectional view illustrating the internal configuration of a light illuminating apparatus 3 according to a third embodiment of the present disclosure. As shown in FIG. 6, the light illuminating apparatus 3 of this embodiment is different from the light illuminating apparatus 1 of the first embodiment in that in addition to the cooling fan 103, a cooling fan 104 is provided on the left side surface of the housing 100. Additionally, as indicated by the arrow in FIG. 5, a cooling wind of the direction opposite to X-axis direction generated by the cooling fan 103, and a cooling wind of X-axis direction generated by the cooling fan 104 flow in the wind tunnel α. Additionally, in this embodiment, the cooling fan 103 and the cooling fan 104 have the same configuration.

When the cooling fans 103, 104 rotate, and air outside of the housing 100 is introduced into the cooling fans 103, 104, the cooling wind of the direction opposite to X-axis direction and the cooling wind of X-axis direction flow in the wind tunnel α, the two collide approximately at the central part of the housing 100, and positive pressure is produced in the wind tunnel α. Air of the wind tunnel α tends to be introduced in between each heat sink fin 420, and because the direction of air flow bends 90°, the air pressure in the wind tunnel α increases and the air speed reduces. By this reason, an amount of air introduced in between each heat sink fin 420 from the wind tunnel α is almost uniform, and an almost uniform amount of air flows over each of the surfaces of the heat sink fins 420 of each heat dissipation element 400, and is discharged from the air hole 101. By this reason, each heat dissipation element 400 is cooled almost uniformly.

As described above, in this embodiment, the direction of the cooling wind generated by the cooling fan 103 (the direction opposite to X-axis direction) and the direction of the cooling wind generated by the cooling fan 104 (X-axis direction), and the direction in which the heat sink fins 420 extend and are installed (the direction opposite to Z-axis direction) are different by 90°, and the direction in which the heat sink fins 420 extend and are installed and the direction in which the air hole 101 is disposed (Y-axis direction) are different by 90°, and the wind tunnel α serves as a sort of pressure chamber. Additionally, the cross-sectional area in the YZ plane of the wind tunnel α and the opening area of the air hole 101 are set such that the pressure of air in the area in which the heat sink fins 420 are arranged is almost uniform. Specifically, in the same way as the first embodiment, the ratio of the opening area of the air hole 101 to the cross-sectional area in the YZ plane of the wind tunnel α is set to 1:0.7-1:1.4, and when the length of Z-axis direction of the air hole 101 is L1, and the length of Z-axis direction of the heat sink fins 420 is h, the above-described conditional expression (1) is satisfied.

Table 3 is a table explaining a result of simulating a relationship between the cross-sectional area in the YZ plane of the wind tunnel α and the opening area of the air hole 101 from the perspective of temperature of the heat dissipation element 400.

Fourth Embodiment

Figure 7A:
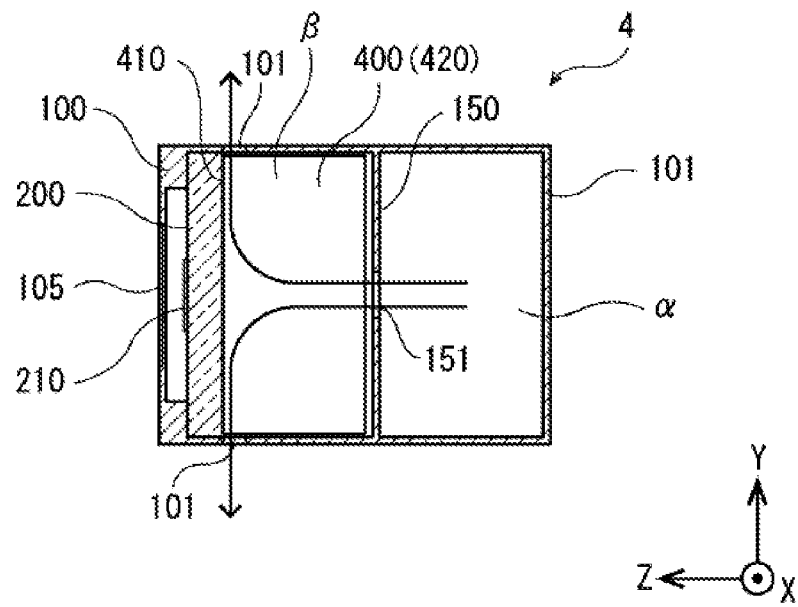
FIGS. 7A and 7B are diagrams illustrating the internal configuration of a light illuminating apparatus according to a fourth embodiment of the present disclosure.
Figure 7B:
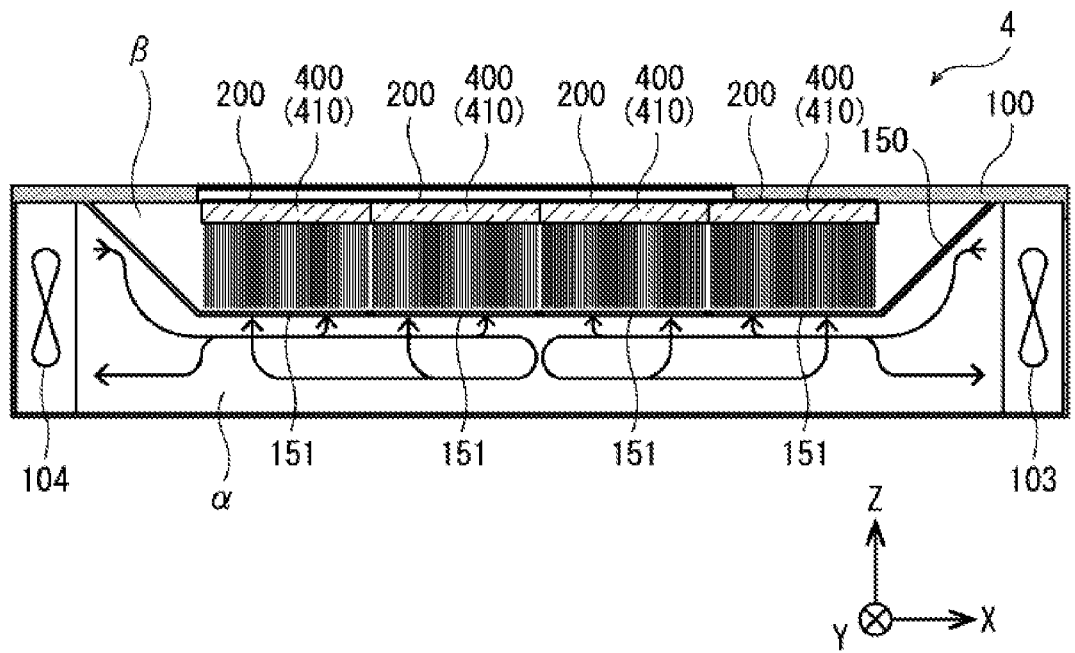

FIG. 7 is a cross-sectional view illustrating the internal configuration of a light illuminating apparatus 4 according to a fourth embodiment of the present disclosure. As shown in FIG. 7, the light illuminating apparatus 4 of this embodiment is different from the light illuminating apparatus 2 of the second embodiment in that in addition to the cooling fan 103, a cooling fan 104 is provided on the left side surface of the housing 100, in the same way as the third embodiment. Additionally, as indicated by the arrow in FIG. 7, a cooling wind of the direction opposite to X-axis direction generated by the cooling fan 103 and a cooling wind of X-axis direction generated by the cooling fan 104 flow in the wind tunnel α. Additionally, also in this embodiment, the cooling fan 103 and the cooling fan 104 have the same configuration.

When the cooling fans 103, 104 rotate, and air outside of the housing 100 is introduced from the cooling fans 103, 104, the cooling wind of the direction opposite to X-axis direction and the cooling wind of X-axis direction flow in the wind tunnel α, the two collide approximately at the central part of the housing 100, and positive pressure is produced in the wind tunnel α. Air of the wind tunnel α tends to be introduced into each heat sink fin 420 through the through-holes 151, and because the direction of air flow bends 90°, the air pressure in the wind tunnel α increases and the air speed reduces. By this reason, an amount of air introduced into the through-holes 151 from the wind tunnel α (i.e., between each heat sink fin 420) is almost uniform, and an almost uniform amount of air flows over each of the surfaces of the heat sink fins 420 of each heat dissipation element 400, and is discharged from the air hole 101. By this reason, each heat dissipation element 400 is cooled almost uniformly.

As described above, in this embodiment, the direction of the cooling wind generated by the cooling fan 103 (the direction opposite to X-axis direction) and the direction of the cooling wind generated by the cooling fan 104 (X-axis direction), and the opening direction of the through-holes 151 (Z-axis direction) are different by 90°, and the direction in which the heat sink fins 420 extend and are installed and the direction in which the air hole 101 is disposed (Y-axis direction) are different by 90°, and the wind tunnel α serves as a sort of pressure chamber. Additionally, the cross-sectional area in the YZ plane of the wind tunnel α and the opening area of the air hole 101 are set such that the pressure of air in the area in which the through-holes 151 are arranged is almost uniform. Specifically, in the same way as the

TABLE 3

| | | temperature of the heat dissipation element | | | |
|---|---|---|---|---|---|
| No. | cross-sectional area of the wind tunnel:opening area of the air hole | maximum temperature [° C.] | average temperature [° C.] | minimum temperature [° C.] | temperature difference [° C.] |
| example 10 | 1:0.715 | 65 | 63.9 | 61.6 | 3.4 |

As shown in Table 3, as a result of simulation, when the ratio of the opening area of the air hole 101 to the cross-sectional area in the YZ plane of the wind tunnel α is set to 1:0.7-1:1.4, and the above-described conditional expression (1) is satisfied, it can be seen that a temperature difference of the heat dissipation elements 400 is 10° C. or less (i.e., cooling the plurality of LED devices 210 without any problem in the actual use).

second embodiment, the ratio of the opening area of the through-holes 151 to the cross-sectional area in the YZ plane of the wind tunnel α is set to 1:0.7-1:1.4, and when the opening area of the air hole 101 is S1, and the opening area of the through-holes 151 is S2, the above-described conditional expression (2) is satisfied.

Table 4 is a table explaining a simulating a relationship between the cross-sectional area in the YZ plane of the wind tunnel α and the opening area of the through-holes 151 from the perspective of temperature of the heat dissipation element 400.

TABLE 4

| | | temperature of the heat dissipation element | | | |
|---|---|---|---|---|---|
| No. | cross-sectional area of the wind tunnel:opening area of the through-holes | maximum temperature [° C.] | average temperature [° C.] | minimum temperature [° C.] | temperature difference [° C.] |
| example 11 | 1:0.715 | 61.9 | 60.3 | 58.6 | 3.3 |

As shown in Table 4, as a result of simulation, when the ratio of the opening area of the through-holes 151 to the cross-sectional area in the YZ plane of the wind tunnel α is set to 1:0.7-1:1.4, and the above-described conditional expression (2) is satisfied, it can be seen that a temperature difference of the heat dissipation elements 400 is 10° C. or less (i.e., cooling the plurality of LED devices 210 without any problem in the actual use).

Additionally, it should be understood that the disclosed embodiments are illustrative in all aspects and are not limitative. The scope of the present disclosure is defined by the appended claims rather than the foregoing description, and is intended to cover all changes within the appended claims and their equivalent meaning and scope.

DETAILED DESCRIPTION OF MAIN ELEMENTS 1, 2, 3, 4 . . . Light illuminating apparatus
100 . . . Housing
101 . . . Air hole
103, 104 . . . Cooling fan
105 . . . Window
150 . . . Partition
151 . . . Through-hole
200 . . . Light source unit
205 . . . Substrate
210 . . . LED device
400 . . . Heat dissipation element
410 . . . Heat sink
420 . . . Heat sink fin

The invention claimed is:

1. A light illuminating apparatus that irradiates, onto a target surface, light of a line shape extending in a first direction and having a predetermined line width in a second direction perpendicular to the first direction, the light illuminating apparatus comprising:
a substrate extending in the first direction;
a light source unit having a plurality of light sources arranged along the first direction on a surface of the substrate;
a heat dissipation unit having a plurality of heat sink fins installed erectly at a predetermined interval along the first direction, and thermally coupled to an opposing surface side of the substrate;
a housing which receives the heat dissipation unit and forms a wind tunnel with a cooling wind flowing inside, wherein the cooling wind cools the heat sink fins; and
a first cooling fan which generates the cooling wind flowing in the first direction within the wind tunnel,
wherein at least one of opposite sides of the second direction of the housing has an air hole through which the cooling wind is discharged to outside via the plurality of heat sink fins, or the cooling wind is absorbed via the plurality of heat sink fins from outside, and
the wind tunnel serves as a pressure chamber in which positive pressure or negative pressure is produced.

2. The light illuminating apparatus according to claim 1, wherein at least one of opposite sides of the second direction of the housing comes into contact with the plurality of heat sink fins.

3. The light illuminating apparatus according to claim 2, wherein the air hole is formed such that bases of the plurality of heat sink fins are exposed to the outside.

4. The light illuminating apparatus according to claim 3, wherein a ratio of a cross-sectional area of the second direction of the wind tunnel and an opening area of the air hole is set to 1:0.7-1:1.4.

5. The light illuminating apparatus according to claim 4, wherein when a length of the second direction of the air hole is L1, and a length of the second direction of each heat sink fin is h, the following conditional expression (1) is satisfied:

$$0.1 \cdot h \leq L1 \leq 0.5 \cdot h \quad (1)$$

6. The light illuminating apparatus according to claim 2, wherein a ratio of a cross-sectional area of the second direction of the wind tunnel and an opening area of the air hole is set to 1:0.7-1:1.4.

7. The light illuminating apparatus according to claim 6, wherein when a length of the second direction of the air hole is L1, and a length of the second direction of each heat sink fin is h, the following conditional expression (1) is satisfied:

$$0.1 \cdot h \leq L1 \leq 0.5 \cdot h \quad (1)$$

8. The light illuminating apparatus according to claim 1 or 2, wherein the air hole is formed such that bases of the plurality of heat sink fins are exposed to the outside.

9. The light illuminating apparatus according to claim 8, wherein a ratio of a cross-sectional area of the second direction of the wind tunnel and an opening area of the air hole is set to 1:0.7-1:1.4.

10. The light illuminating apparatus according to claim 9, wherein when a length of the second direction of the air hole is L1, and a length of the second direction of each heat sink fin is h, the following conditional expression (1) is satisfied:

$$0.1 \cdot h \leq L1 \leq 0.5 \cdot h \quad (1)$$

11. The light illuminating apparatus according to claim 1, wherein a ratio of a cross-sectional area of the second direction of the wind tunnel and an opening area of the air hole is set to 1:0.7-1:1.4.

12. The light illuminating apparatus according to claim 11, wherein when a length of the second direction of the air hole is L1, and a length of the second direction of each heat sink fin is h, the following conditional expression (1) is satisfied:

$$0.1 \cdot h \leq L1 \leq 0.5 \cdot h \quad (1)$$

13. The light illuminating apparatus according to claim 1, wherein the housing has a partition to divide the wind tunnel, and an area in which the plurality of heat sink fins is arranged,
- the partition has a through-hole formed in communication with the wind tunnel and the area in which the plurality of heat sink fins is arranged, and
- a ratio of a cross-sectional area of the second direction of the wind tunnel and an opening area of the through-hole is set to 1:0.7-1:1.4.

14. The light illuminating apparatus according to claim 13, wherein the opening area of the air hole is larger than the opening area of the through-hole.

15. The light illuminating apparatus according to claim 1, wherein the first cooling fan is installed on one surface of the first direction of the housing.

16. The light illuminating apparatus according to claim 15, comprising:
- a second cooling fan installed on the other surface of the first direction of the housing to generate the cooling wind flowing in a direction opposite to the first direction.

17. The light illuminating apparatus according to claim 1, wherein the light is light including a wavelength that acts on an ultraviolet curable resin.

\* \* \* \* \*